(12) United States Patent
Hofer et al.

(10) Patent No.: US 11,605,863 B2
(45) Date of Patent: Mar. 14, 2023

(54) BUSBAR FOR BATTERY SYSTEM AND BATTERY SYSTEM HAVING THE SAME

(71) Applicant: Samsung SDI Co., Ltd., Yongin-si (KR)

(72) Inventors: Maximilian Hofer, Hartberg (AT); Christoph Schmiedhofer, Graz (AT)

(73) Assignee: SAMSUNG SDI CO., LTD., Yongin-si (KR)

( * ) Notice: Subject to any disclaimer, the term of this patent is extended or adjusted under 35 U.S.C. 154(b) by 729 days.

(21) Appl. No.: 16/334,524

(22) PCT Filed: Oct. 26, 2017

(86) PCT No.: PCT/KR2017/011871
§ 371 (c)(1),
(2) Date: Mar. 19, 2019

(87) PCT Pub. No.: WO2018/080177
PCT Pub. Date: May 3, 2018

(65) Prior Publication Data
US 2021/0288386 A1    Sep. 16, 2021

(30) Foreign Application Priority Data

Oct. 26, 2016   (EP) ..................................... 16195806
Oct. 25, 2017   (KR) ......................... 10-2017-0139063

(51) Int. Cl.
*H01M 50/507*   (2021.01)
*H01M 50/519*   (2021.01)
(Continued)

(52) U.S. Cl.
CPC ............ *H01M 50/507* (2021.01); *G01R 1/20* (2013.01); *G01R 31/3835* (2019.01);
(Continued)

(58) Field of Classification Search
CPC .. H01M 50/507; H01M 50/519; H01M 50/51; H01M 50/204; H01M 10/482; H01M 2220/20; G01R 31/3835; G01R 1/20
See application file for complete search history.

(56) References Cited

U.S. PATENT DOCUMENTS

2008/0030208 A1   2/2008   Aratani
2010/0201369 A1   8/2010   Gronwald et al.
(Continued)

FOREIGN PATENT DOCUMENTS

| CN | 102770985 A | 11/2012 |
| CN | 105026943 A | 11/2015 |

(Continued)

OTHER PUBLICATIONS

Second Chinese Office action for Application No. 201780065237.X, dated Sep. 3, 2021, 16 pages.
(Continued)

*Primary Examiner* — Brian R Ohara
*Assistant Examiner* — Emily Elizabeth Freeman
(74) *Attorney, Agent, or Firm* — Lewis Roca Rothgerber Christie LLP

(57) ABSTRACT

A busbar for a battery system according to an exemplary embodiment of the present invention includes: a first bar member and a second bar member which are spaced apart from each other; and a third bar member which connects the first bar member and the second bar member to define a common bar, in which the third bar member is shunt resistance having ohmic resistance and electrically connects the first bar member and the second bar member. In addition, a battery system according to the exemplary embodiment of the present invention includes the busbar.

17 Claims, 3 Drawing Sheets

(51) Int. Cl.
   *H01M 50/51*   (2021.01)
   *H01M 50/204*  (2021.01)
   *H01M 10/48*   (2006.01)
   *G01R 31/3835* (2019.01)
   *G01R 1/20*    (2006.01)

(52) U.S. Cl.
   CPC ....... *H01M 10/482* (2013.01); *H01M 50/204* (2021.01); *H01M 50/51* (2021.01); *H01M 50/519* (2021.01); *H01M 2220/20* (2013.01)

(56) References Cited

U.S. PATENT DOCUMENTS

| | | | |
|---|---|---|---|
| 2012/0019061 A1 | 1/2012 | Nishihara et al. | |
| 2013/0200700 A1* | 8/2013 | Ohkura | B60L 50/64 307/10.7 |
| 2015/0369877 A1 | 12/2015 | Frenzel et al. | |
| 2016/0111757 A1 | 4/2016 | Kim et al. | |
| 2017/0125775 A1* | 5/2017 | Chen | H01M 50/516 |

FOREIGN PATENT DOCUMENTS

| | | |
|---|---|---|
| DE | 10 2007 033 182 A1 | 1/2009 |
| DE | 10 2013 210 128 A1 | 9/2014 |
| EP | 2 541 641 A1 | 1/2013 |
| FR | 3056757 A1 * | 3/2018 .......... H01M 8/0202 |
| JP | 2007-073266 A | 3/2007 |
| JP | 2008-39571 A | 2/2008 |
| JP | 2012-515418 A | 7/2012 |
| JP | 2012-160552 A | 8/2012 |
| JP | 2012160552 A * | 8/2012 |
| JP | 2015-15211 A | 1/2015 |
| JP | 5718396 B2 | 5/2015 |
| KR | 10-2012-0003432 A | 1/2012 |
| KR | 10-2013-0049984 A | 5/2013 |
| KR | 10-2016-0046372 A | 4/2016 |
| WO | WO 2010/081085 A1 | 7/2010 |
| WO | WO 2011/105095 A1 | 9/2011 |

OTHER PUBLICATIONS

Chinese Office action and Search Report issued in corresponding CN Application No. 201780065237.X, dated Apr. 8, 2021, 21 pages.
Chinese Office action issued in corresponding application No. CN 201780065237.X, dated Mar. 30, 2022, 25 pages.
Chinese Office action issued in corresponding application No. 2017-80065237.X, dated Sep. 2, 2022, 26 pages, with English Translation.

* cited by examiner

[Figure 1]
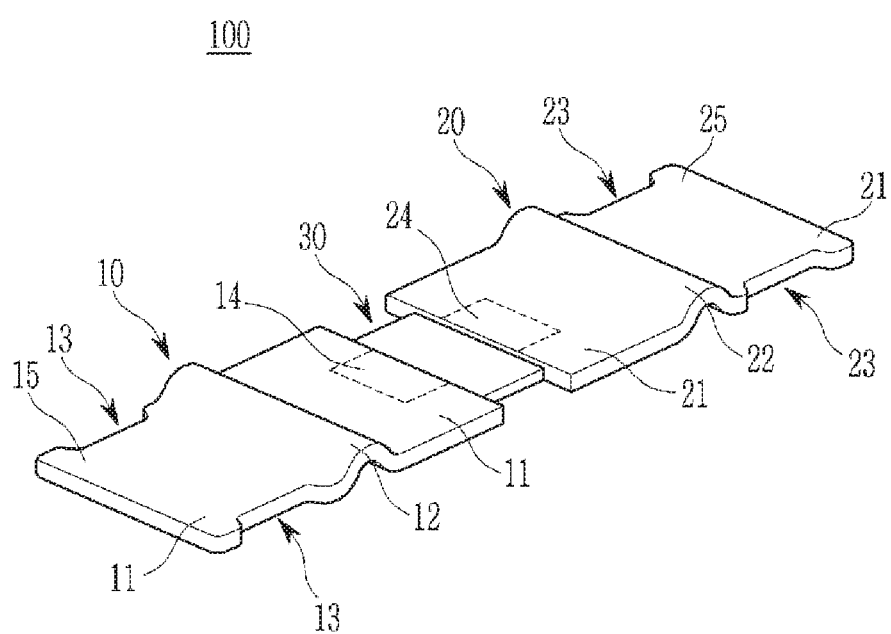

【Figure 2】
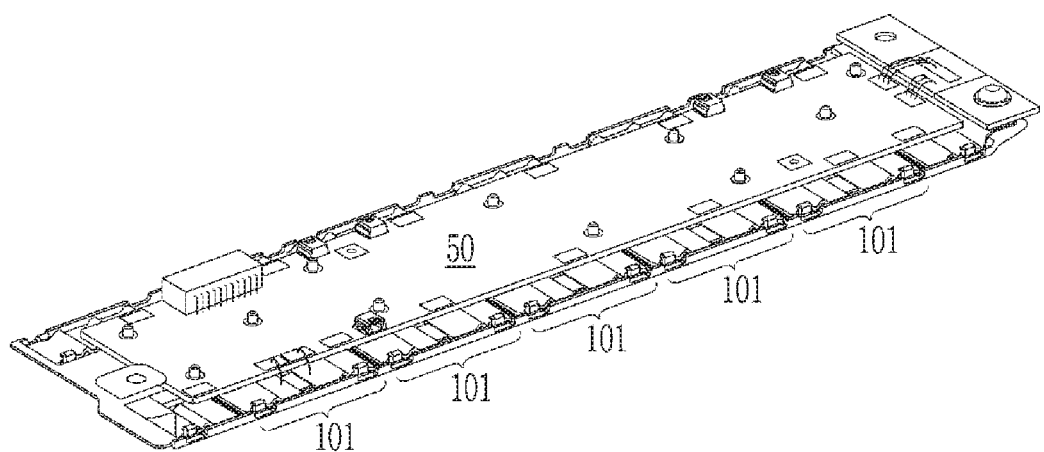
【Figure 3】
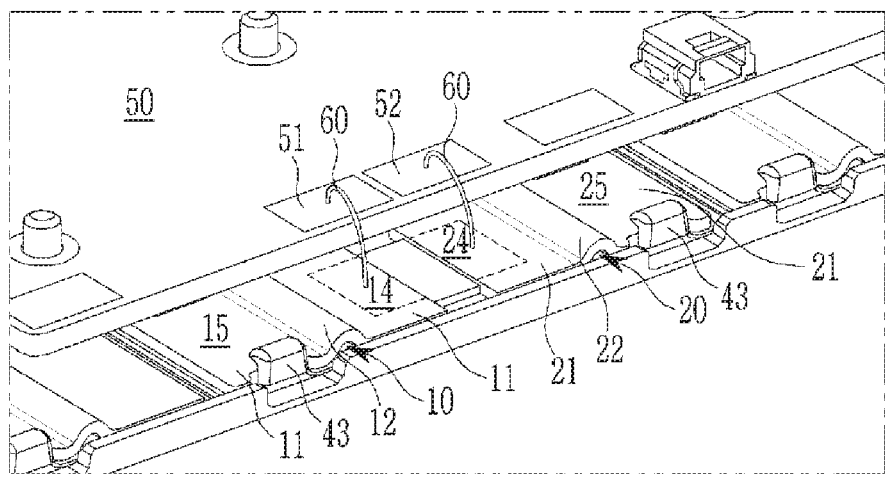

[Figure 4]
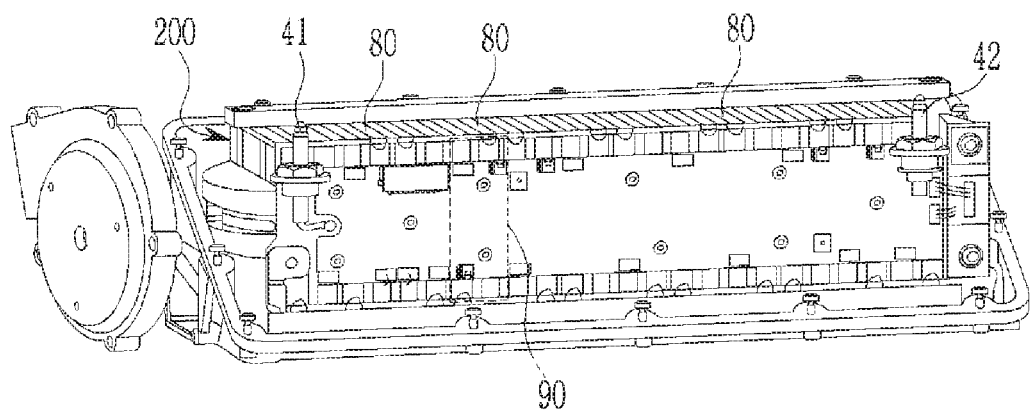
[Figure 5]
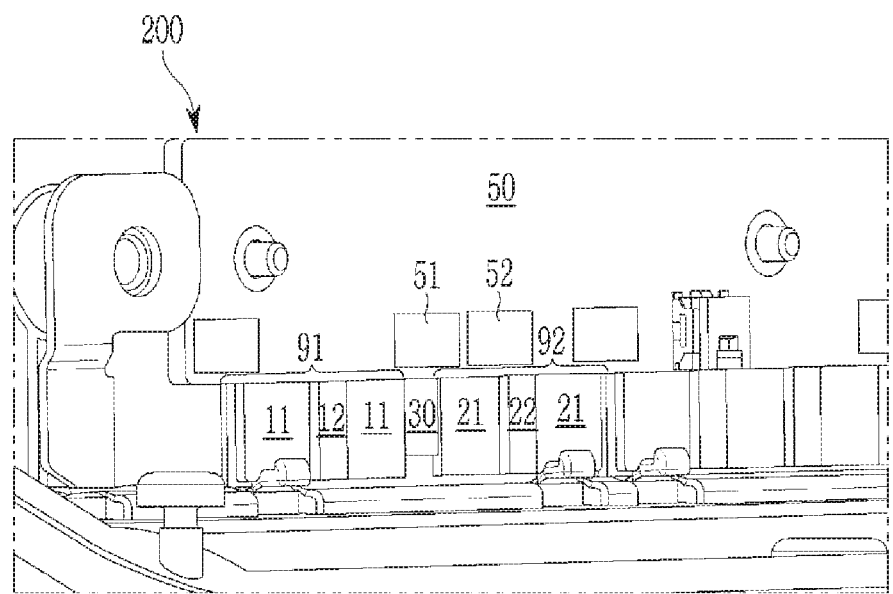

BUSBAR FOR BATTERY SYSTEM AND BATTERY SYSTEM HAVING THE SAME

CROSS-REFERENCE TO RELATED APPLICATION(S)

This application is a National Phase Patent Application of International Patent Application Number PCT/KR2017/011871, filed on Oct. 26, 2017, which claims priority to European Patent Application No. 16195806.1, filed Oct. 26, 2016 and Korean Patent Application No. 10-2017-0139063, filed Oct. 25, 2017. The entire contents of all of which are incorporated herein by reference.

TECHNICAL FIELD

The present disclosure relates to a busbar for a battery system, which has an integrated shunt, and a battery system having the busbar.

BACKGROUND ART

A rechargeable battery differs from a primary battery in that the rechargeable battery may be repeatedly charged and discharged, and the primary battery provides only irreversible conversion that cannot convert a chemical substance back into electrical energy. A rechargeable battery having a low capacity is used as a power source for a small-sized electronic device such as a mobile phone, a notebook computer, and a camcorder, and a rechargeable battery having a high capacity is used as a power source for a hybrid vehicle or the like.

In general, the rechargeable battery includes: an electrode assembly which includes a positive electrode, a negative electrode, and a separator interposed between the positive electrode and the negative electrode; a casing which accommodates the electrode assembly; and an electrode terminal which is electrically connected to the electrode assembly. An electrolyte is applied so that the battery may be charged and discharged by electrochemical reactions between the positive electrode, the negative electrode, and an electrolyte solution. A shape of the casing, for example, a cylindrical shape or a rectangular shape, varies depending on the purpose of the battery.

The rechargeable battery is used in the form of a battery module including multiple unit battery cells coupled in series and/or in parallel, such that the rechargeable battery is provided as a battery having high energy density, for example, a battery for driving a motor for a hybrid vehicle. That is, the battery module is formed by connecting the electrode terminals of the multiple unit battery cells in accordance with a required amount of electric power in order to implement a high-output rechargeable battery, for example, a rechargeable battery for an electric vehicle.

The battery module may be configured based on block design or module design. In the case of the block design, the respective battery cells are connected to a common current collector structure and a common battery management system (BMS). In the case of the module design, the multiple battery cells are connected to form sub modules, and some of the sub modules are connected to form the battery module. A battery management function may be implemented at a level of the module or the sub module, such that compatibility between the components is improved. One or more of the battery modules are mechanically and electrically integrated, mounted with a thermal management system, and set to communicate with one or more electrical consumers in order to define a battery system.

To provide the thermal management to the battery system, the thermal management system is required to safely use the one or more battery modules by efficiently discharging, releasing, and/or radiating heat produced from the rechargeable battery. If the heat is not sufficiently discharged, released, and/or radiated, temperature deviations occur between the respective battery cells, and as a result, the one or more battery modules cannot create a desired amount of electric power. In addition, an increase in temperature in the battery module causes an abnormal reaction in the battery module, and thereby a performance of charging and discharging the rechargeable battery deteriorates and a lifespan of the battery is reduced. Therefore, it is necessary to effectively discharge, release, and/or radiate heat from the battery cell in order to cool the battery cell. In the case of the module design, to provide electrical integration of the battery system, the sub modules having the multiple battery cells connected in parallel are connected in series (XsYp) or the sub modules having the multiple cells connected in series are connected in parallel (XpYs). The XsYp-type sub modules are suitable to produce a high voltage, but wiring complexity is increased because voltage levels of the respective cells need to be individually controlled. In the case of the XpYs type sub modules, voltage levels of all of the cells connected in parallel are automatically balanced. Therefore, wiring complexity is decreased because the voltage is sufficiently controlled at the level of the sub module. In the sub module having the battery cells connected in parallel, capacitances of the cells are integrated, and thus most of the XpYs type sub modules are used together with the cells having low capacities.

The static management of battery power output and discharge is not sufficient to meet dynamic electric power demands of various electrical consumers connected to the battery system. Therefore, consistent information exchange is required between the battery system and managers of the electrical consumers, and the information includes actual or predicted electric power demands or surplus consumers as well as an actual state of charge (SoC) of the battery system, potential electric performances, charging abilities, and internal resistance. In general, the battery system includes a battery management system (BMS), and a battery management unit (BMU) for processing the information.

In general, in the case of a lithium-ion battery system, it is necessary to monitor the voltage of each battery cell. The reason is that overcharge and a low voltage of the battery cell may cause a security risk and reduce a service lifespan of the system. In addition, an electric current of the battery system is detected in order to derive an actual state of charge (SOC). A general method of measuring an electric current of the battery system is to introduce a shunt having ohmic resistance having a precisely small value to a path of the electric current of the battery system. It is possible to measure a value of the electric current by using known resistance by measuring a voltage drop through the shunt. Because the measured value of the voltage drop, which is measured through the shunt, needs to be small, a high-precision voltage detecting system, which is mainly realized by an application specific integrated circuit (ASIC), needs to be connected to the shunt.

In general, a dedicated shunt sensor, which is provided by a professional provider, is used for the battery system. The dedicated sensor needs to be connected to a customized circuit carrier specially manufactured for this purpose, and as a result, additional costs are incurred due to the shunt itself and the additional circuit carrier. In particular, in a vehicle field, the shunt sensor is often applied to a small-sized housing that constitutes a part of a positive battery clamp. Therefore, the design of the clamp needs to be changed, and an additional space for installing the shunt is required.

DISCLOSURE

Technical Problem

The present invention has been made in an effort to provide a busbar, which has an integrated shunt, and a battery system having the busbar, which require low costs and a small installation space in comparison with the related art.

Technical Solution

An exemplary embodiment of the present invention provides a busbar for a battery system, the busbar including: a first bar member and a second bar member which are spaced apart from each other in a longitudinal direction of a busbar and/or a battery system.

The busbar may connect battery cells in the battery system and/or cell terminals of battery modules, and the busbar may electrically connect terminals of the battery cell in the battery system. The busbar may be further configured to be interchangeable with an electrical interconnector, which connects the battery cells in the battery system, that is, a common busbar.

The busbar may further include a third member which connects the first bar member and the second bar member to define a common bar. That is, the third bar member structurally connects the first bar member and the second bar member, and the third bar member may be, for example, a separable connecting member such as a plug or screw engagement or a non-separable connecting member connected to the first bar member and the second bar member by welding, soldering, adhesion, or attachment.

According to the exemplary embodiment of the present invention, the third bar member may be shunt resistance having ohmic resistance, and may electrically connect the first bar member and the second bar member. That is, an ohmic resistor having ohmic resistance is structurally and electrically integrated with the busbar.

The shunt includes a voltage drop of 100 mV or less from a maximum electric current, particularly, a voltage drop of 75 mV or less, and more particularly, a voltage drop of 50 mV or less, and the maximum electric current is 250 A, particularly, 500 A, and more particularly, 750 A. The shunt may include ohmic resistance of 10 μΩ to 200 μΩ, particularly, ohmic resistance of 25 μΩ to 150 μΩ, and more particularly, ohmic resistance of 50 μΩ to 100 μΩ. In addition, a low temperature coefficient of the shunt resistance is advantageous, and the temperature coefficient is 100 ppm or less, particularly, 75 ppm or less, more particularly, 50 ppm or less. More particularly, the shunt resistance, that is, the third bar member may include manganin, that is, an alloy consisting of copper 86%, manganese 12%, and nickel 2%, or the third bar member may be made of this alloy. Alternatively, the third bar member may include constantan, that is, an alloy consisting of copper 55% and nickel 45%, or the third bar member may be made of this alloy.

Therefore, according to the exemplary embodiment of the present invention, it is possible to omit an additional dedicated shunt as well as a circuit carrier for an additional shunt, and as a result, it is possible to provide a battery system having reduced material costs and requirement related to an installation space as compared to the battery system in the related art. The busbar according to the present invention may be electrically connected to the cell terminal in a similar or the same manner as a surplus electrical interconnector. For this reason, it is possible to omit an additional fixing means, for example, an additional screw, such that the entire system becomes rigid. The increase in shunt resistance does not require additional contact, and as a result, overall contact resistance of the battery system is reduced.

According to the exemplary embodiment of the present invention, a lower side of the first bar member of the busbar may be electrically and/or structurally connected to one or more first cell terminals having a first polarity, and a lower side of the second bar member may be electrically and/or structurally connected to second cell terminals which have a second polarity and are equal in number to the first cell terminals. A material, a size, and a shape of each of the bar members may be adjusted to be suitable for the battery cell terminal to be connected to the bar member. Each of the first bar member and the second bar member may be connected to one or more of the cell terminals, and particularly, each of the bar members may be connected to the multiple battery cell terminals connected in parallel.

According to the exemplary embodiment of the present invention, the first bar member may include or may be made of the same material as the first cell terminal having the first polarity, and as a result, it is possible to easily prevent bimetallic corrosion. In the exemplary embodiment, the material of the first terminal may be applied as the material of the entire first bar member or may be applied to the contact portion which is actually in contact with the first terminal.

According to the exemplary embodiment of the present invention, the second bar member may include or may be made of the same material as the second cell terminal having the second polarity. In the exemplary embodiment, since the second bar member may include or may be made of the same material as the second cell terminal of the second polarity, it is possible to easily prevent bimetallic corrosion. Here, the material of the second terminal may be applied as the material of the entire second bar member or may be applied to the contact portion which is actually in contact with the second terminal.

In summary, in the case of the busbar according to the exemplary embodiment of the present invention, the first bar member, the second bar member, and the third bar member may be made of different materials. The materials of the terminals having the first polarity or the second polarity may be applied to the first bar member and the second bar member. The third bar member may be made of, for example, a material, such as manganin or constantan, having low resistance. In addition, the first bar member, the second bar member, and the third bar member may be welded to form a monolithic busbar having minimum contact resistance at interfaces between the bar members.

According to the exemplary embodiment of the present invention, each of the first bar member and the second bar member includes the multiple contact portions, and each of the contact portions may be electrically connected to a single cell terminal. In other words, each of the first bar member and the second bar member includes a segment structure, and each segment may be electrically and/or structurally connected to the single cell terminal, for example, in terms of shapes and sizes. Therefore, the first bar member and the second bar member may be adjusted to be suitable for the number of battery cells which are connected in parallel in a battery cell module of the battery system. In other words, the busbar electrically connects the battery cell modules in series, and each of the battery cell modules may include multiple single battery cells connected in parallel.

The terminals of the neighboring battery cells may not be immediately in contact with one another in order to prevent a short circuit or creeping caused by spatial restriction, for example. Therefore, the neighboring contact portions in the first bar member may be electrically connected by a separation portion, and the neighboring contact portions in the second bar member may be electrically connected by a separation portion. A size of the separation portion may be adjusted to be suitable for a distance between the neighboring battery terminals. In other words, each of the first bar member and the second bar member has the segment structure, zones in the bar members are connected to one another by the separation portions, and the first bar member and the second bar member may be entirely connected to each other by the third bar member, that is, the shunt resistance.

In the exemplary embodiment of the present invention, a width of the separation portion in a longitudinal direction of the busbar may be equal to a width of the third bar member in the longitudinal direction of the busbar and/or in a longitudinal direction of the battery system. The third bar member and the separation portion have the same size, such that the busbar according to the exemplary embodiment of the present invention may be freely disposed in the battery system. In other words, the busbar according to the exemplary embodiment of the present invention may be interchangeable with the electrical interconnector in the battery system.

In the exemplary embodiment of the present invention, the electrical interconnector may include a first bar member and a second bar member which are identical to the bar members of the busbar according to the exemplary embodiment of the present invention. However, the first bar member and the second bar member of the electrical interconnector may be electrically connected through another separation portion which is substituted for the third bar member. Even in this case, an overall size of the busbar may be equal to a size of the electrical interconnector at least in the longitudinal direction of the battery system.

Because the configuration of the busbar and the configuration of the electrical interconnector are mostly identical to each other, a module system may be provided, and the first bar member and the second bar member may have the same shape in order to further improve interchangeability and modularity of the battery system.

In the case of the busbar according to the exemplary embodiment of the present invention, a first contact pad may be disposed on the first bar member. Further, as another example, the first contact pad may be disposed at an upper side of the first bar member so as to be immediately adjacent to the third bar region.

In the case of the busbar according to the exemplary embodiment of the present invention, a second contact pad may be disposed on the second bar member. Further, as another example, the second contact pad may be disposed at an upper side of the second bar member so as to be immediately adjacent to the third bar region.

Here, the first contact pad and the second contact pad may provide high-quality ohmic contact to a sensing circuit for a shunt resistance. Alternatively, for example, the contact pads may provide a contact structure such as wire connection for connecting each of the contact pads to the sensing circuit and may provide high-quality ohmic contact having low contact resistance. Alternatively, the contact pad is provided at the lateral side of the third bar member, such that the shunts are connected in parallel, and it is possible to always measure an electric current of the single battery cell independently of the number of cell terminals which are in contact with each other by the first bar member or the second bar member. In addition, only a part of a surface of the bar member may be optimized to implement the high-quality ohmic contact and may be optimized by, for example, adjusting roughness of the surface or coating the surface with a contact agent. Therefore, it is possible to additionally reduce material costs or omit or optimize a process step.

The exemplary embodiment of the present invention provides the battery system which includes a first system terminal having the first polarity and a second system terminal having the second polarity, and has the multiple battery cell modules which are connected in series between the first system terminal and the second system terminal. Here, each of the battery cell modules includes one or more battery cells, the multiple battery cells are connected in parallel in the single battery cell module, and each of the battery cells may include the first cell terminal have the first polarity and the second cell terminal having the second polarity. The battery system further includes the one or more busbars according to the aforementioned exemplary embodiment of the present invention. The busbar electrically connects the one or more second cell terminals of the first cell module and the one or more first cell terminals of the second cell module. Here, the first bar member may be electrically connected to the one or more second cell terminals of the first cell module among the multiple battery cell modules, the second bar member may be electrically connected to the one or more first cell terminals of the second cell module among the multiple battery cell modules, and the busbar may be connected, by welding, to the cell terminals in order to connect the cell terminals.

In other words, in the battery system, the busbar may connect the first battery cell and/or the first battery cell module to the second battery cell and/or the second battery cell module.

In the exemplary embodiment of the present invention, the polarities may be alternately arranged in the battery system so that the neighboring battery cells and/or the battery cell modules connected in series and the neighboring battery cells and/or the neighboring terminals of the battery cell modules have different polarities in order to reduce an installation space and wiring complexity. Therefore, in the battery system according to the exemplary embodiment of the present invention, the busbar may mainly connect the terminals which are made of different materials and have different polarities. The first bar member and the one or more second cell terminals may include a first material, the second bar member and the one or more first cell terminals may include a second material, and the third bar member may include a third material. The first, second, and third materials are different from one another.

In the battery system according to the exemplary embodiment of the present invention, a distance between the cell terminals, which are adjacent to one another in the longitudinal direction of the battery system, may be equal to a width of the third bar member in the longitudinal direction of the battery system. In other words, the third bar member may be applied to a free space between the cell terminals which are adjacent to one another in the longitudinal direction of the battery system. Therefore, it is possible to optimize contact areas between the cell terminals and the bar member zones.

In still another exemplary embodiment of the present invention, the battery system may include the multiple electrical interconnectors for connecting the cell terminals including no shunt. Each of the electrical interconnectors may include the first bar member and the second bar member which are spaced apart from each other, and each of the bar members may be adjusted to be electrically connected to the cell terminals in terms of shapes, sizes, and/or materials. The first bar member and the second bar member may be configured to be identical to the first bar member and the second bar member of the aforementioned busbar. In addition, the first bar member and the second bar member of the electrical interconnector may be electrically and structurally connected by a separation portion. A width of the separation portion may be equal to a distance between the cell terminals which are adjacent to each other in the longitudinal direction of the battery system. Since the battery system according to the exemplary embodiment of the present invention may include the module structure with respect to the busbar and the electrical interconnector, it is possible to reduce material costs, the requirement related to the installation space, and manufacturing complexity.

In yet another exemplary embodiment of the present invention, in the case of the busbar and the electrical interconnector, the first bar member may have the same shape and the same size as the second bar member. Therefore, to convert the electrical interconnector into the busbar, one separation zone may be substituted with the third bar member, and the contact pad may be formed immediately adjacent to the third bar member.

In yet another exemplary embodiment of the present invention, the battery system may further include a cell supervision circuit (CSC) which is electrically connected to the busbar and includes a sensing circuit, and the sensing circuit may detect a voltage drop through the shunt resistance, for example, a voltage between the first contact pad and the second contact pad. The cell supervision circuit (CSC) may include a first sensing pad which is electrically connected to the first contact pad, and a second sensing pad which is electrically connected to the second contact pad. The cell supervision circuit (CSC) may monitor a cell voltage of the battery cell of the battery system, may actively or manually balance voltages of the individual battery cells, and may communicate with an electrical consumer or a control electronic device.

The cell supervision circuit (CSC) may include a circuit carrier such as a flexible circuit board (FCP) or a printed circuit board (PCB), and the sensing pad may be a metallized surface of the FCP or PCB. In the exemplary embodiment, the busbar may be connected to the cell supervision circuit (CSC) by wiring, and for example, each of the contact pads may be connected to one of the sensing pads by wiring. The wire may include one or more of aluminum, copper, silver, and gold, and the cell supervision circuit (CSC) may further include a metallized contact surface which is configured to be individually connected, for example, by wiring, to the single battery cell in order to measure a voltage.

A method of manufacturing the battery system according to the exemplary embodiment of the present invention may include: providing the multiple battery cell modules each of which includes the first cell terminal, the second cell terminal, and the one or more battery cells connected in parallel; assembling the battery cell modules by stacking the battery cell modules so that the neighboring terminals of the neighboring battery cell modules have different polarities; connecting the cell terminals of the neighboring battery modules by using the one or more busbar and the one or more electrical interconnectors according to the present invention in order to electrically connect the multiple battery modules in series between the first terminal and the second terminal; mechanically connecting the assembled battery cell modules and the CSC; and connecting the metallized contact surface of the CSC to the individual battery cells and the sensing pad through the contact pads of the busbar by wiring in a single wire bonding step.

Therefore, the battery system according to the exemplary embodiment of the present invention may be manufactured by a simple method, and the electrical connection between the shunt resistance and the cell supervision circuit (CSC) may be acquired simultaneously with the electrical connection between the individual battery cells and the metallized contact surface of the cell supervision circuit (CSC) for measuring a voltage. In addition, a processing method in the related art may be used to electrically connect the shunt resistance to the sensing circuit provided on the cell supervision circuit (CSC) which is a part of the battery system. In addition, an additional mounting process or a constituent element for adding the shunt resistance to the battery system according to the exemplary embodiment of the present invention may not be required.

According to the exemplary embodiment of the present invention, there may be provided an electric vehicle including the aforementioned busbar and the aforementioned battery system. In addition, another aspect of the present invention can be known from the following description.

Advantageous Effects

According to the exemplary embodiment of the present invention, the third member, which electrically connects the first bar member and the second bar member, is formed as the shunt resistance, and thus the busbar with the integrated shunt is provided, such that a carrier for an additional shunt and an additional dedicated shunt are not required, and as a result, it is possible to provide the battery system that reduces the requirement related to the installation space and the manufacturing complexity in comparison with the related art.

DESCRIPTION OF THE DRAWINGS

FIG. 1 is a schematic perspective view of a busbar according to an exemplary embodiment of the present invention.

FIG. 2 is a schematic perspective view of a battery system according to a first exemplary embodiment of the present invention.

FIG. 3 is an enlarged view of a circuit sensing circuit of the battery system illustrated in FIG. 2.

FIG. 4 is a schematic perspective view of a battery system according to a second exemplary embodiment of the present invention.

FIG. 5 is an enlarged view of a circuit sensing circuit of the battery system illustrated in FIG. 4.

MODE FOR INVENTION

Hereinafter, an exemplary embodiment of the present invention will be described in detail with reference to the accompanying drawings so that those skilled in the technical field to which the present invention pertains may easily carry out the exemplary embodiment. As those skilled in the art would realize, the described embodiments may be modified in various different ways, all without departing from the spirit or scope of the present invention. The drawings and description are to be regarded as illustrative in nature and not restrictive. Like reference numerals designate like elements throughout the specification.

Throughout this specification and the claims, when one constituent element is referred to as being "directly connected to" another constituent element, one constituent element can be directly connected to the other constituent element, and one constituent element can also be "indirectly connected to" the other element with other elements therebetween. In addition, unless explicitly described to the contrary, the word "comprise" and variations such as "comprises" or "comprising", will be understood to imply the inclusion of stated elements but not the exclusion of any other elements.

In addition, in the present specification, the term "and/or" includes any and all combinations of a plurality of the associated listed items. That is, in the present specification, the words 'A and/or B' may include 'A or B', 'A', 'B', and 'both A and B'.

FIG. 1 illustrates a busbar according to an exemplary embodiment of the present invention. A busbar 100 includes a first bar member 10, a second bar member 20, and a third bar member 30. The first bar member 10 includes two contact portions 11 separated by a separation portion 12, each of the contact portion 11 has a flat shape, and the separation portion 12 has a convex curved shape. However, the separation portion 12 may be formed flat or concavely between the contact portions 11. The first bar member 10 is suitable to be electrically connected to two second cell terminals having a second polarity. In particular, each of the contact portions 11 has a size and a shape adapted to a size and a shape of one of the second cell terminals. The first bar member 10 is made of aluminum which is a material of the second cell terminal. The contact portion 11 at the outermost side further includes double-sided constrictions 13, and each of the double-sided constrictions 13 includes an extension portion in a width direction of the busbar 100 which is smaller than an extension portion in a width direction of the inner contact portion 11. Referring to FIG. 3, in the constrictions 13, the busbar 100 may be configured to be coupled to corresponding struts 43 of a battery system, such that the busbar 100 may be fixed in a longitudinal direction of the busbar 100 which is perpendicular to the width direction of the busbar 100.

The second bar member 20 includes two contact portions 21 separated by a separation portion 22, each of the contact portions 21 has a flat shape, and the separation portion 22 has a convex curved shape. However, the separation portion 22 may be formed flat or concavely between the contact portions 21. The second bar member 20 is suitable to be electrically connected to two first cell terminals having a first polarity. In particular, each of the contact portions 21 has a size and a shape adapted to a size and a shape of one of the first cell terminals. The second bar member 20 is made of copper which is a material of the first cell terminal. The contact portion 21 at the outermost side further includes double-sided constrictions 23, and each of the double-sided constrictions 23 includes an extension portion in the width direction of the busbar 100 which is smaller than an extension portion in a width direction of the inner contact portion 21. Referring to FIG. 3, in the constrictions 23, the busbar 100 may be configured to be coupled to the corresponding struts 43 of the battery system, such that the busbar may be fixed in the longitudinal direction of the busbar which is perpendicular to the width direction of the busbar. The second bar member 20 has the same size and the same shape as the first bar member 10.

The third bar member 30 is welded between the first bar member 10 and the second bar member 20, such that the first bar member 10 and the second bar member 20 are structurally and electrically connected. The third bar member 30 includes an extension portion in the width direction of the busbar 100 which is smaller than the extension portion of the first bar member 10 and the extension portion of the second bar member 20. The third bar member 100 is made of manganin and thus has low ohmic resistance which is less sensitive to a temperature. The inner contact portion 11 of the first bar member 10 includes a first contact pad 14, and the inner contact portion 21 of the second bar member 20 includes a second contact pad 24. The first contact pad 14 and the second contact pad 24 are positioned immediately adjacent to the third bar member 30. During a process of operating the battery system, the first bar member 10 is electrically connected to the cell terminal having the second polarity, and the second bar member 20 is electrically connected to the cell terminal having the first polarity. Next, the electric current flowing between the cell terminals may be derived from a voltage drop which are measured through the third bar member 30 in a state in which the first contact pad 14 and the second contact pad 24 are appropriately connected to a sensing circuit.

FIG. 2 illustrates the battery system according to the exemplary embodiment of the present invention, and FIG. 3 illustrates an enlarged view of a circuit sensing circuit of the battery system. The circuit sensing circuit (CSC) is mounted on an upper portion of the battery system. The CSC 50 includes a printed circuit board (PCB) having multiple surfaces on which electrical components are mounted, and metallized surfaces configured to connect the electrical components. Multiple electrical interconnectors 101 are further provided on the upper portion of the battery system so as to be structurally and electrically connected to the busbar 100 according to the present invention and the four cell terminals of the battery cells stacked in the battery system. Therefore, in the battery system, each battery cell module includes two battery cells connected in parallel, and each of the electrical interconnectors 101 and the busbar 100 electrically connect the two battery cell modules in series. The CSC 50 further includes a first sensing pad 51 which is electrically connected to the first contact pad 14 by an aluminum wire 60, and a second sensing pad 52 which is electrically connected to the second contact pad 24 by another aluminum wire 60. To reduce contact resistance between the wires 60 and the contact portions 11 and 21, an upper surface 15 of the first bar member 10 and an upper surface 25 of the second bar member 20 are coated with aluminum contact pads 14 and 24, respectively.

FIG. 4 illustrates the battery system according to the exemplary embodiment of the present invention, and FIG. 5 illustrates an enlarged view of the circuit sensing circuit of the battery system. Here, multiple angular battery cells 80 are stacked in a longitudinal direction of a battery system 200 so that wide sides of the neighboring battery cells 80 face each other. The two battery cells 80 are electrically connected in parallel to define one battery cell module 90. In the battery system 200, polarities of the subsequent battery cell modules 90 are alternately arranged. That is, in a case in which a first battery cell module 91 includes two terminals having a first polarity at an upper side of the battery system 200 and two terminals having a second polarity at a lower side of the battery system 200, an adjacent second battery cell module 92 includes two terminals having the second polarity at the upper side of the battery system 200 and two terminals having the first polarity at the lower side of the battery system 200. Therefore, for example, the two terminals having the second polarity at the lower side of the battery system 200 and the two terminals having the first polarity at the lower side of the battery system 200 are electrically connected to one another through the busbar 100 or the electrical interconnectors 10, such that the battery cell modules 91 and 92 are electrically connected in series. The multiple battery cell modules 90 stacked in the battery system 200 are electrically connected in series between a first system terminal 41 and a second system terminal 42 of the battery system 200. The battery system 200 further includes a CSC 50 mechanically connected to a lateral side of the battery system 200. The CSC 50 includes a first sensing pad 51 which is electrically connected to an inner contact portion 11 of a first bar member 10 through an aluminum wire 60, and a second sensing pad 52 which is electrically connected to an inner contact portion 21 of a second bar member 20 through another aluminum wire 60.

The electronic or electric devices and/or any other relevant devices or components of a display according to the exemplary embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. The electrical connection or interconnection described in the present specification may be implemented by wires or conductive members, for example, on a PCB or other types of circuit carriers. The conductive member may include a metal plate including, for example, metallized surfaces and/or pins, and/or may include conductive polymers or ceramics. Additional electrical energy may be transmitted via wireless connection, for example, electromagnetic radiation and/or light.

Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like.

Further, those skilled in the art should recognize that the functionality of various computing devices may be combined or integrated into a single computing device, or the functionality of a particular computing device may be distributed across one or more other computing devices without departing from the spirit and scope of the exemplary embodiments of the present invention.

While the exemplary embodiments of the present invention have been described above, the present invention is not limited thereto, and various modifications can be made and carried out within the scope of the claims, the detailed description of the invention, and the accompanying drawings, and also fall within the scope of the invention.

<Description of symbols>

| | |
|---|---|
| 10: First bar member | 20: Second bar member |
| 11, 21: Contact portion | 12, 22: Separation portion |
| 13, 23: Constriction | 14, 24: First and second contact pads |
| 30: Third bar member | |
| 50: Circuit sensing circuit | 51, 52: First and second sensing pads |
| 80: Battery cell | 90: Battery cell module |
| 100: Busbar | 200: Battery system |

The invention claimed is:

1. A busbar for a battery system, the busbar comprising:
a first bar member made of a first material;
a second bar member made of a second material different from the first material, the second bar member being spaced apart from the first bar member; and
a third bar member connecting the first bar member and the second bar member to define a common bar,
wherein the third bar member is a shunt resistor having an ohmic resistance and electrically connects the first bar member and the second bar member,
wherein the first bar member and the second bar member include multiple contact portions, respectively,
wherein two neighboring ones of the contact portions in the first bar member are electrically connected by a first separation portion, and
wherein each of the contact portions is respectively electrically connected to a different single cell terminal.

2. The busbar of claim 1, wherein:
the first bar member is electrically connected to one or more first cell terminals having a first polarity, and
the second bar member is electrically connected to one or more second cell terminals which have a second polarity and are equal in number to the one or more first cell terminals.

3. The busbar of claim 1, wherein:
two neighboring ones of the contact portions in the first bar member are electrically connected by a separation portion, and two neighboring ones of the contact portions in the second bar member are electrically connected by a second separation portion.

4. The busbar of claim 3, wherein:
a width of the first separation portion in a longitudinal direction of the busbar is equal to a width of the third bar member in the longitudinal direction of the busbar.

5. The busbar of claim 1, wherein:
the first material is applied to a cell terminal having a first polarity,
the second material is applied to a cell terminal having a second polarity, and
the third bar member is made of manganin or constantan.

6. The busbar of claim 1, wherein:
a first contact pad is disposed on the first bar member immediately adjacent to the third bar member, and
a second contact pad is disposed on the second bar member immediately adjacent to the third bar member.

7. A battery system comprising: a first system terminal having a first polarity and a second system terminal having a second polarity;
multiple battery cell modules which are connected in series between the first system terminal and the second system terminal and include one or more battery cells which have a first cell terminal having a first polarity and a second cell terminal having a second polarity; and
one or more busbars according to claim 1 which electrically connect at least one second cell terminal of a first cell module among the multiple battery cell modules and at least one first cell terminal of a second cell module among the multiple battery cell modules, wherein the first bar member is electrically connected to the at least one second cell terminal of the first cell module, and the second bar member is electrically connected to at least one first terminal of the second cell module.

8. The battery system of claim 7, wherein:

the at least one second cell terminal is made of the first material, and the at least one first cell terminal is made of the second material.

9. The battery system of claim 7, wherein:

a distance between one of the one or more first cell terminals and the neighboring one of the one or more second cell terminals in a longitudinal direction of the battery system is equal to a width of the third bar member in the longitudinal direction of the battery system.

10. The battery system of claim 7, further comprising:

an electrical interconnector which is interchangeable with the busbar in the battery system, wherein the electrical interconnector includes a first bar member and a second bar member, and the first bar member and the second bar member of the electrical interconnector are electrically and structurally connected by a separation portion.

11. The battery system of claim 7, further comprising:

a cell supervision circuit which is electrically connected to the busbar; and a sensing circuit which is configured to measure a voltage drop through shunt resistance.

12. The battery system of claim 11, wherein:

a first contact pad is disposed on the first bar member immediately adjacent to the third bar member, a second contact pad is disposed on the second bar member immediately adjacent to the third bar member, and the cell supervision circuit includes a first sensing pad electrically connected to the first contact pad, and a second sensing pad electrically connected to the second contact pad.

13. The battery system of claim 11, wherein:

the busbar is connected to the cell supervision circuit by wiring.

14. An electric vehicle comprising the busbar according to claim 1.

15. The busbar of claim 2, wherein:

the first bar member and the second bar member include multiple contact portions, respectively.

16. The busbar of claim 15, wherein:

two neighboring ones of the contact portions in the first bar member are electrically connected by a separation portion, and two neighboring ones of the contact portions in the second bar member are electrically connected by a second separation portion.

17. The busbar of claim 16, wherein:

a width of the first separation portion in a longitudinal direction of the busbar is equal to a width of the third bar member in the longitudinal direction of the busbar.

* * * * *